United States Patent
Yuasa et al.

(10) Patent No.: US 6,805,487 B1
(45) Date of Patent: Oct. 19, 2004

(54) HOLDER DRIVING UNIT

(75) Inventors: Satoru Yuasa, Kyoto (JP); Yoshio Tamura, Kyoto (JP); Makoto Nakaya, Kyoto (JP); Tomoyasu Matsuno, Kyoto (JP); Nobuo Nagai, Kyoto (JP)

(73) Assignee: Nissin Electric Co., Ltd., Kyoto (JP)

( * ) Notice: Subject to any disclaimer, the term of this patent is extended or adjusted under 35 U.S.C. 154(b) by 0 days.

(21) Appl. No.: 08/953,638

(22) Filed: Oct. 17, 1997

(30) Foreign Application Priority Data

Oct. 18, 1996 (JP) .............................................. 8-297452

(51) Int. Cl.[7] .......................... F16C 33/72; F16J 15/40
(52) U.S. Cl. ......................... 384/16; 277/431; 277/913
(58) Field of Search ............................ 384/12, 15, 16, 384/100, 114, 131, 132, 134; 277/431, 514, 913

(56) References Cited

U.S. PATENT DOCUMENTS

| | | | |
|---|---|---|---|
| 3,949,996 A | * 4/1976 | Inoue et al. | ............ 384/132 X |
| 4,361,332 A | * 11/1982 | Logan et al. | ............... 277/431 |
| 4,726,689 A | 2/1988 | Pollock | ........................ 384/12 |
| 4,749,283 A | * 6/1988 | Yokomatsu et al. | ...... 384/16 X |
| 4,797,053 A | 1/1989 | Balter | |
| 4,812,101 A | * 3/1989 | George et al. | ............ 384/15 X |

FOREIGN PATENT DOCUMENTS

| | | |
|---|---|---|
| DE | 34 00 265 A | 7/1984 |
| EP | 0 398 190 A2 | 11/1990 |
| EP | 0 518 372 A1 | 12/1992 |
| FR | 2 602 911 | 2/1988 |

* cited by examiner

Primary Examiner—Thomas R. Hannon
(74) Attorney, Agent, or Firm—Finnegan Henderson Farabow Garrett & Dunner, L.L.P.

(57) ABSTRACT

A holder driving device has: a holder holding a substrate, a shaft supporting the holder, a driver for driving the shaft reciprocatingly and linearly in the direction along the shaft, a bearing unit having mechanical linear motion bearings for supporting the shaft thereon and having one or more stages of exhaust chambers surrounding the shaft; a vacuum pump for vacuum-pumping the exhaust chambers of the bearing unit; and a gas replacement mechanism for supplying dry gas, the humidity of which is lower than that of at least the surrounding atmosphere and the pressure of which is positive, from the outside of the bearing unit to at least the neighborhood of an atmosphere-side entrance portion of a gap between an end portion of the bearing unit one the side opposite to the vacuum vessel and the shaft passing the end portion, so as to replace the atmosphere near the entrance portion by the dry gas.

6 Claims, 5 Drawing Sheets

HOLDER DRIVING UNIT

BACKGROUND OF THE INVENTION

1. Field of the Invention

The present invention relates to a holder driving device which is used, for example, in an ion-implantation apparatus of a hybrid scan system, etc., and which drives mechanically a holder holding a substrate to reciprocate linearly in a vacuum vessel, and more specifically, it relates to a unit for preventing moisture in the atmosphere from flowing into its bearing unit using a differential pumping system to thereby prevent the vacuum seal performance of the bearing unit from lowering.

2. Description of the Related Art

For example, an ion-implantation apparatus of a hybrid scan system is designed to scan an ion beam reciprocatingly in a vacuum vessel in one direction, and at the same time to scan a substrate reciprocatingly mechanically in the direction substantially perpendicular to the scanning direction of the ion beam so as to perform uniform ion-implantation in the whole surface of the substrate. A holder driving device for driving a holder holding the substrate linearly and reciprocatingly in the vacuum vessel is used in such an ion-implantation apparatus.

Although it can be considered that a packing such as an O-ring or the like is used for vacuum seal in the portion where a shaft of such a holder driving device is penetrating the vacuum vessel, it is difficult to increase the driving speed of the shaft with such a packing, and it is also necessary to exchange the packing periodically because of abrasion. To this end, there is a case where differential pumping is used. In the above example, the differential pumping means a system where one or more stages of exhaust chambers are provided between the vacuum vessel and the atmosphere, and the exhaust chambers are pumped by a vacuum pump, so that the pressure in the exhaust chambers is set to values between the pressure in the vacuum vessel and the atmospheric pressure. With such differential pumping, the vacuum seal in the above-mentioned penetration portion can be attained without using any packing.

FIG. 5 shows an example of an ion-implantation apparatus of a hybrid scan system having a conventional holder driving device using such differential pumping.

This ion-implantation apparatus is configured so that in a vacuum vessel 4, an ion beam 2 travelling from the surface of the paper toward the back is made to perform scanning reciprocatingly electrically (that is, by means of an electric field or a magnetic field) in the direction X (for example, the horizontal direction, and that applies to the following description), while a holder 12 holding a substrate 6 (for example, a semiconductor wafer) is made to perform scanning reciprocatingly mechanically in the direction Y substantially perpendicular to the above-mentioned direction X (for example, in the vertical direction, and that applies to the following description) by means of a holder driving device 10 so as to radiate the ion beam 2 over the whole surface of the substrate 6 uniformly to perform ion-implantation therein.

The vacuum vessel 4 is disposed in the atmosphere, and the inside thereof is pumped up to a high vacuum, for example, about $1 \times 10^{-6}$ Torr to $1 \times 10^{-7}$ Torr, by means of a not-shown vacuum pump.

This holder driving device 10 is that which is disclosed in U.S. Pat. No. 4,726,689 and which comprises the above-mentioned holder 12, a shaft 14 supporting the holder 12 and penetrating the vacuum vessel 4, a driver (not-shown) provided outside the vacuum vessel 4 and for driving the shaft 14 linearly and reciprocatingly in the direction Y, a gas bearing unit 16 attached to the outside of the vacuum vessel 4 so as to vacuum-seal the portion where the shaft 14 penetrates the vacuum vessel 4, and a vacuum pump and a compressed gas supply means (both not shown) for this gas bearing unit 16.

The gas bearing unit 16 is constituted by a combination of a gas bearing and differential pumping. That is, this gas bearing unit 16 has plural stages (four stages in the illustrated example) of exhaust chambers 18 to 21 surrounding the shaft 14 in a housing (also called a sleeve) 17 of the unit 16. The respective exhaust chambers 18 to 21 are pumped by not-shown four vacuum pumps respectively so that they become higher in the degree of vacuum toward the vacuum vessel 4 side. Consequently, the above-mentioned differential pumping is realized.

This gas bearing unit 16 is further configured so that compressed gas 24 supplied from a not-shown compressed gas supply means is fed through an entrance 22 to a gap with its size managed accurately between a housing 17 and the shaft 14 to form a gas layer which is extremely thin (for example, about 13 $\mu$m or less) in the gap so as to make the axes of the housing 17 and the shaft 14 coincident with each other to thereby make the shaft 14 held without contacting. Thus, gas bearing is realized. The pressure of the compressed gas 24 fed to the entrance 22 is usually about 6 kgf/cm$^2$ in terms of gauge pressure. Most of the compressed gas 24 fed to the entrance 22 is discharged to the outside through an exhaust port 26 provided between the entrance 22 and the exhaust chamber 21, and the rest of the gas 24 leaks out to the atmosphere through a gap in the lower end portion of the housing 17.

In order to improve the vacuum seal performance in the gas bearing unit 16 using such differential pumping, it is generally necessary to adopt and successfully combine methods such as a method in which a gap portion is elongated in the direction along the shaft 14 between the shaft 14 and the housing 17 in order to reduce the conductance between the shaft 14 and the housing 17, a method in which a number of exhaust chambers are provided to thereby increase the number of stages of differential pumping, and a method in which vacuum pumps which are high in pumping speed are used.

The method using vacuum pumps which are high in pumping speed increases the cost. Either of the method in which a gap portion is elongated and the method in which the number of stages of differential pumping is made large causes the length of the gas bearing unit 16 to be elongated in the direction along the shaft 14 to thereby increase the lengthwise size of the holder driving device 10.

However, in such an ion-implantation apparatus of a hybrid scan system, beam line height (height from a floor surface 28 to a beam line 3) H to scan with the ion beam 2 cannot be made so high, because of the limitation of the handling height of the substrate 6, the maintenance height of an ion source for emitting the ion beam 2, the total height of the ion-implantation apparatus, and so on. Therefore, the lengthwise size of the holder driving device 10 also has a limit.

Therefore, there is a limit in increasing the number of stages of differential pumping in the gas bearing unit 16 or in elongating the length of the gap portion in the direction along the shaft 14.

In the gas bearing unit 16 configured under such a limitation, it was found that a good vacuum seal performance is not maintained and resulted in a bad vacuum in the vacuum vessel 4 if the driving rate is increased when the shaft 14 was driven reciprocatingly and linearly as mentioned above, while the degree of vacuum in the vacuum vessel 4 was not influenced when the shaft 14 was not driven.

For example, the maximum rate of scanning the holder 12 mechanically in the direction Y usually reaches about 250 to 300 mm/sec. Even in that case, it is necessary to suppress the deterioration of the degree of vacuum in the vacuum vessel 4 to be not larger than about 10% of the ultimate degree of vacuum (for example, about 1 to $5 \times^{-7}$ Torr), but this is difficult to realize for the above-mentioned gas bearing unit 16. In the gas bearing unit 16, the scanning rate of the holder 12 is limited to about 50 mm/sec in order to suppress the deterioration of the degree of vacuum to be within the above-mentioned range.

In order to find out the reasons for the deterioration of the degree of vacuum, the composition of gas in the vacuum vessel 4 when the degree of vacuum deteriorated was investigated by using a quadrupole mass spectrometer and as a result it was found that moisture entered the vacuum vessel 4 together with the shaft 14 when the shaft 14 entered the vacuum vessel 4. It is considered that the deterioration of the degree of vacuum is caused by the fact that moisture contained in the atmosphere enters the first stage (atmosphere-side) exhaust chamber 21 and changes therein into waterdrops (or ice pieces) because of the decrease of temperature caused by adiabatic expansion of the moisture, and then the waterdrops (or ice pieces) enter the vacuum vessel 4 through the other exhaust chambers 20 to 18 successively. If the moisture changes into waterdrops or ice pieces, it is difficult to pump those waterdrops or ice pieces in the next stages of exhaust chambers 20 to 18.

Although there is a thought to use also a packing such as an O-ring or the like in the gas bearing unit 16, the packing slides linearly relative to the shaft 14, so that it is difficult for the packing to prevent moisture from passing from between the shaft 14 and the packing.

SUMMARY OF THE INVENTION

It is therefore a main object of the present invention to provide a holder driving device in which it is possible to prevent moisture in the atmosphere from flowing into a first stage exhaust chamber of a bearing unit using differential pumping, so that it is possible to prevent the vacuum seal performance in the bearing unit from deteriorating when a shaft is driven reciprocatingly and linearly at a high speed.

The foregoing object of the invention is achieved by providing a holder driving device having: a holder holding a substrate, the holder provided in a vacuum vessel disposed in the atmosphere; a shaft supporting the holder and penetrating the vacuum vessel; a driver provided outside the vacuum vessel and driving the shaft reciprocatingly and linearly in an axial direction of the shaft; a bearing unit attached on the outside of the vacuum vessel so that the shaft passes through the bearing unit, and the bearing unit having at least one of mechanical direct-acting bearings for supporting the shaft and at least one of exhaust chambers surrounding the shaft; a vacuum pump for vacuum-pumping the exhaust chambers of the bearing unit; and a gas replacement mechanism for supplying dry gas in the neighborhood of an atmosphere-side entrance portion of a gap between an end portion of the bearing unit of a side opposite to the vacuum vessel and the shaft passing the end to portion, so as to replace the atmosphere in the vicinity of the entrance portion by the dry gas, the dry gas being lower in humidity than at least the surrounding atmosphere and being a positive pressure.

Preferably, the gas replacement mechanism is constituted by a purge chamber provided so as to partition between the end portion of the bearing unit on the side opposite to the vacuum vessel and the atmosphere side and so as to surround the shaft passing the end portion, and a gas supply means for supplying the purge chamber with dry gas the humidity of which is lower than that of at least the surrounding atmosphere and the pressure of which is positive.

Alternatively, it is preferable to constitute the gas replacement mechanism by an isolation vessel, and a gas supply means for supplying the isolation vessel with dry gas which is lower in humidity than that of at least the surrounding atmosphere and which has positive pressure. The isolation vessel surrounds, with separation from the atmosphere, the end portion of the bearing unit on the side opposite to the vacuum vessel, the shaft projecting outside from the end portion, and the whole of the periphery of the driving device for driving the shaft.

According to the above-mentioned configuration, at least the atmosphere near the entrance portion of the gap in the atmosphere-side end portion of the bearing unit using differential pumping can be replaced by the dry gas by means of the gas replacement mechanism, so that it is possible to prevent the atmosphere from flowing into the first stage exhaust chamber of the bearing unit to thereby prevent moisture in the atmosphere from flowing into the first stage exhaust chamber. Accordingly, it is possible to prevent the vacuum seal performance in the bearing unit from being deteriorated even when the shaft is driven so as to reciprocate linearly at a high speed.

BRIEF DESCRIPTION OF THE DRAWINGS FIGURES

DETAILED DESCRIPTION OF THE PREFERRED EMBODIMENTS

Figure 1:
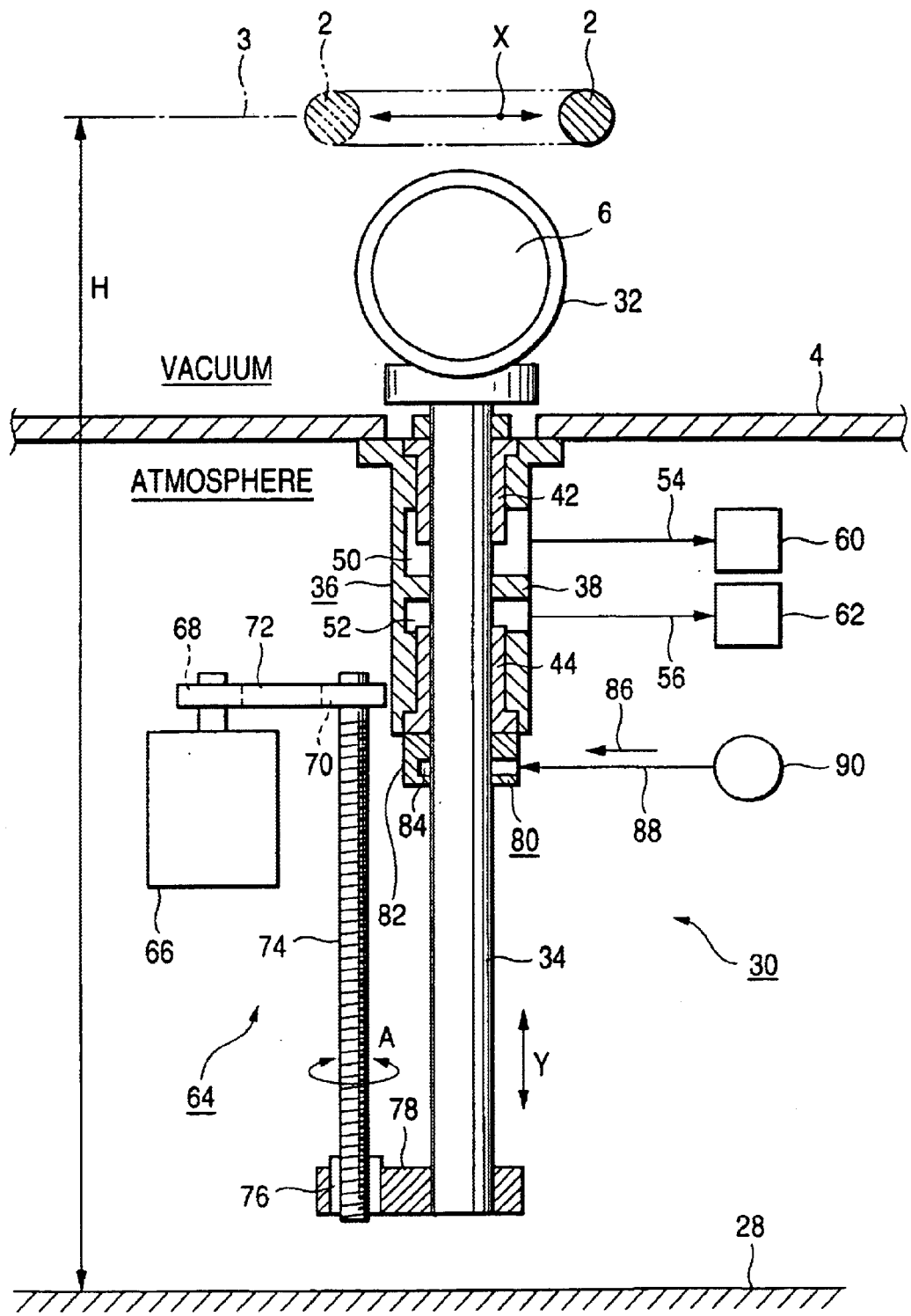
FIG. 1 is a diagram partially illustrating an ion-implantation apparatus of a hybrid scan system with an embodiment of the holder driving device according to the present invention.
Figure 2:
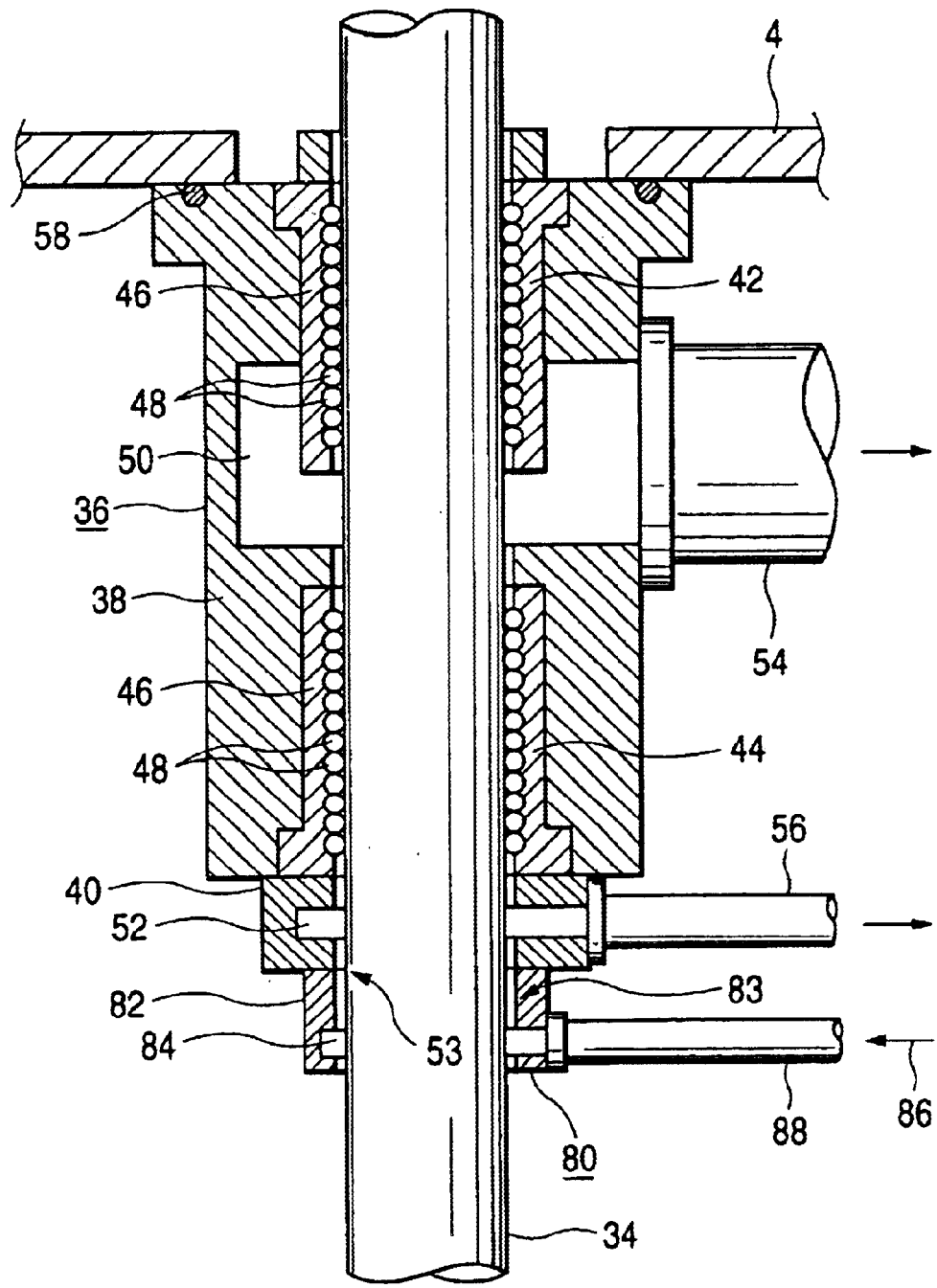
FIG. 2 is an enlarged sectional view of the surroundings of a bearing unit of FIG. 1.

FIG. 1 is a diagram illustrating partially an ion-implantation apparatus of a hybrid scan system provided with an embodiment of a holder driving device according to the present invention. FIG. 2 is an enlarged sectional view of the surroundings of the bearing unit in FIG. 1.

Figure 5:
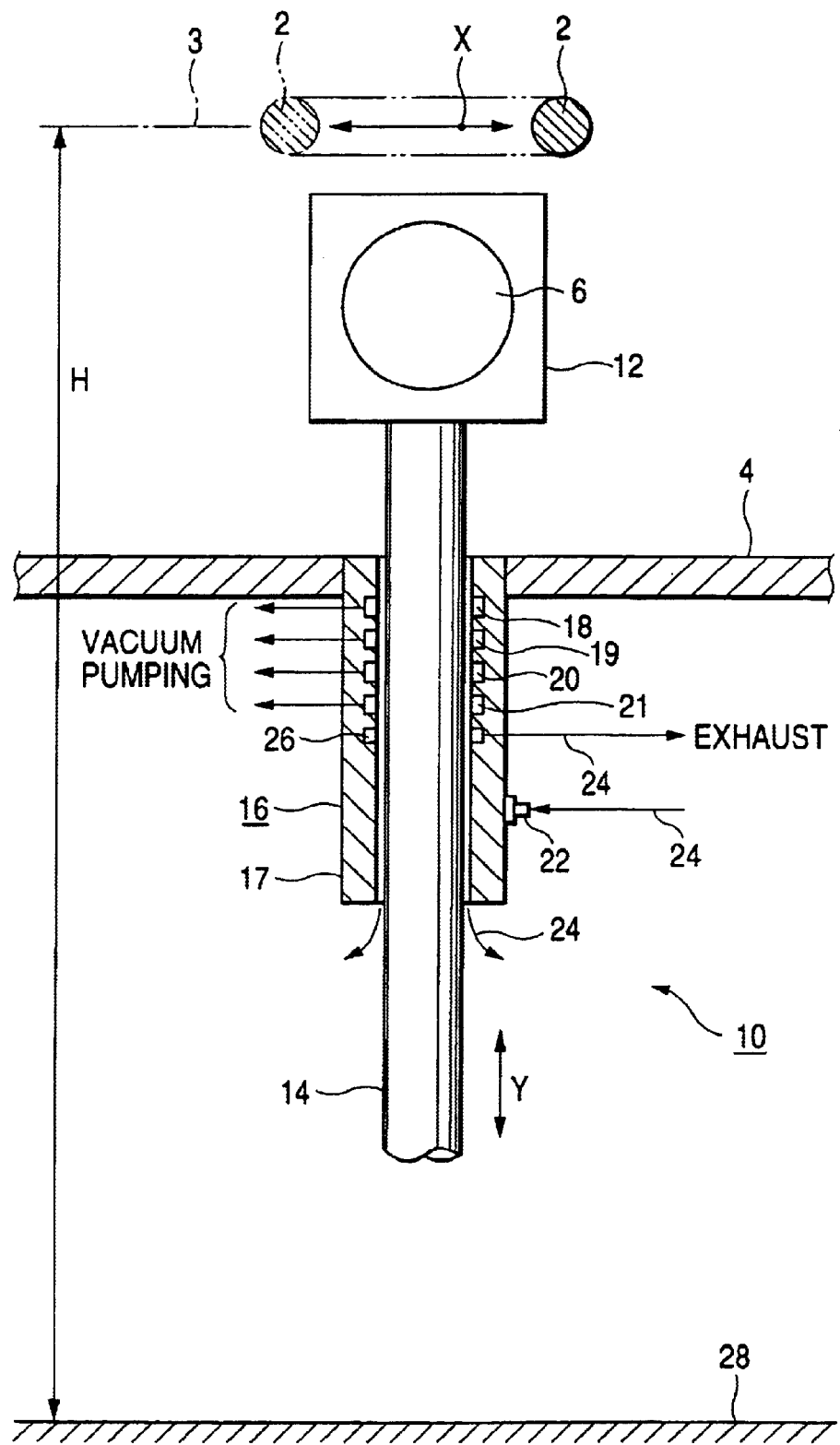
FIG. 5 is a diagram partially illustrating an example of the ion-implantation apparatus of a hybrid scan system with a conventional holder driving device.

An ion beam 2, a vacuum vessel 4 and a substrate 6 in this ion-implantation apparatus are similar to those in the conventional example shown in FIG. 5. Therefore, the description of those parts is not repeated here while reference is made on the description about the parts of FIG. 5.

A holder driving device 30 in this embodiment includes: a holder 32 provided in a vacuum vessel 4 for holding a substrate 6; a shaft 34 supporting this holder 32 and penetrating the wall of the vacuum vessel 4 in the above-mentioned direction Y; a driver 64 provided outside the vacuum vessel 4 for driving the shaft 34 to reciprocate linearly in the direction along the shaft 34, that is, in the direction Y; a bearing unit 36 mounted on the direct outside of the vacuum vessel 4 for vacuum-sealing the portion where the shaft 34 penetrates the vacuum vessel 4; two vacuum pumps 60 and 62 respectively for vacuum-pumping two stages (in this embodiment) of exhaust chambers 50 and 52 of the bearing unit 36; and a gas replacement mechanism 80 for supplying dry gas 86 to the neighborhood of an entrance portion of a gap between an atmosphere-side end portion of the bearing unit 36 and the shaft 34 passing through the end portion to thereby remove the atmosphere near the entrance portion to replace the atmosphere by the dry gas 86.

In this embodiment, the driver 64 includes: a reversible motor 66; a ball screw 74 disposed in parallel with the shaft 34; timing pulleys 68 and 70 and a timing belt 72 for coupling the output shaft of the motor 66 with this ball screw 74; a ball nut 76 screwed to the ball screw 74; and a coupling body 78 for coupling this ball nut 76 with the lower end portion of the shaft 34.

When the motor 66 is rotated forward or backward, the ball screw 74 coupled with the motor 66 is rotated forward or backward as shown by the arrow A, so that the shaft 34 is driven to reciprocate linearly in the direction Y through the ball nut 76 screwed to this ball screw 74.

The above-mentioned driver 64 may be constituted by a linear motion actuator such as a linear motor, a pneumatic cylinder, a hydraulic cylinder, etc. Of those, the linear motor is particularly preferable because its velocity can be controlled accurately.

A stroke to scan the shaft 34 mechanically in the direction Y by the driver 64 depends on the size of the substrate 6. For example, it is about 300 mm when the diameter of the substrate 6 is 8 inches, and about 400 mm when the diameter of the substrate 6 is 12 inches.

The shaft 34 is penetrating the bearing unit 36. Mainly with reference to FIG. 2, in this embodiment, this bearing unit 36 has two stages of mechanical direct-acting bearings 42 and 44 supporting the shaft 34 so as to be movable to perform reciprocating linear motion, and two stages of annular exhaust chambers 50 and 52 surrounding the shaft 34. It will go well if the number of direct-acting bearings is one or more, but two stages is most preferable. This is because deflection of the shaft 34 is large if the number of the stages is one, and it is difficult to make all the axes of the bearings and the shaft 34 coincident with each other, if the number of the stages is three or more.

Each of the linear motion bearings 42 and 44 is a linear ball bearing in this embodiment. Each of the linear motion bearings 42 and 44 has a cage 46 fixed to the inside of a housing 38 of the bearing unit 36, and a plurality of balls 48 kept rotatable in the cage 46. Also, in this embodiment, each of the linear motion bearings 42 and 44 may be composed of a sliding bearing.

The exhaust chamber 50 near the vacuum vessel 4 is formed in the housing 38. The exhaust chamber 52 near the atmosphere may be formed in the housing 38 together with the exhaust chamber 50 as shown in examples of FIGS. 1 and 3, or may be formed in another housing 40 made adjacent to the lower end portion of the housing 38 as shown in FIGS. 2 and 4 by way of example. A gap between the housing 38 and the vacuum vessel 4 is vacuum-sealed by a packing 58 such as an O-ring or the like.

Since this bearing unit 36 uses mechanical bearings, it is not necessary to make gaps between the shaft 34 and the housing, etc. on the periphery of the shaft 34 extremely small unlike in the gas bearing unit 16 shown in FIG. 5. The gap between the housings 38 and 40 and the shaft 34 and the gap between the inner surface portion of a housing 82 which will be described later and the outer surface portion of the shaft 34 may be set to a range of from about several tens $\mu$m to 50 $\mu$m with a comparatively large allowance in design.

Both the exhaust chambers 50 and 52 are vacuum-pumped by the vacuum pumps 60 and 62 through pipe arrangements 54 and 56 respectively. Specifically, the chambers are pumped so that the degree of vacuum in the exhaust chamber 50 on the vacuum vessel 4 side is higher than that in the exhaust chamber 52 on the atmosphere side, and, the degree of vacuum in the vacuum vessel 4 is higher than that in the exhaust chamber 50. In order to realize this condition, for example, the vacuum pump 60 is constituted by a turbo-molecular pump, and the vacuum pump 62 is constituted by a roughing vacuum pump such as a rotary pump or the like. The vacuum vessel 4 is vacuum-pumped, for example, by a cryopump. Alternatively, both the exhaust chambers 50 and 52 may be pumped by a common vacuum pump while a differential pressure is given to the chambers by use of an orifice or the like.

In this embodiment, the gas replacement mechanism 80 is constituted by: an annular purge chamber 84 which is provided to partition the end portion of the bearing unit 36 on the side opposite to the vacuum vessel 4 (corresponding to the end of the housing 40 on the atmosphere side in the example of FIG. 2) and the atmosphere so as to surround the periphery of the shaft 34 passing through the end portion; a dry gas source 90 as a gas supply means for supplying this purge chamber 84 with dry gas 86 of positive pressure and a pipe arrangement 88.

The purge chamber 84 is formed in a housing 82 which is attached to the lower end portion of the housing 38 (in the case of the example of FIG. 1) or the housing 40 (in the case of the example of FIG. 2) so as to surround the periphery of the shaft 34. Preferably, the purge chamber 84 in the housing 82 is formed near the atmosphere-side end portion as shown in enlargement in FIG. 2. With such a configuration, a gap 83 on the side opposite to the atmosphere side (that is, on the bearing 36 side) can be enlarged in the direction along the shaft 34 so as to more reduce the conductance in it, so that it is possible to more effectively prevent the atmosphere containing moisture from flowing toward the bearing unit 36 from the atmosphere side.

The dry gas 86 supplied from the dry gas source 90 to the purge chamber 84 is lower in humidity than at least the atmosphere surrounding the bearing unit 36 and so on. Specifically, the dry gas 86 is dry nitrogen gas, dry air, or the like. In the case of dry air, more specifically, it is preferable to use the air having the dew-point temperature of which is controlled to be below about −170° C.

In addition, the dry gas 86 of positive pressure (that is, having pressure higher than the atmosphere) is supplied from the dry gas source 90 to the purge chamber 84. If the dry gas 86 of such pressure is supplied, the dry gas 86 spouts out of the purge chamber 84 to act as if it is a gas curtain, so that this purge chamber 84 can aggressively prevent the atmosphere from flowing into the bearing unit 36 from the atmosphere side through the purge chamber 84.

This dry gas 86 is to prevent the atmosphere from flowing into the first stage exhaust chamber 52 of the bearing unit 36, and it is not necessary to form a gas bearing as in the case of the gas bearing unit 16 shown in FIG. 5. Therefore, the pressure of the dry gas 86 may be much lower than that in the conventional example in FIG. 5. More specifically, it is sufficient that the pressure of the dry gas 86 supplied from the dry gas source 90 to the purge chamber 84 (or an isolation vessel 92 or an annular pipe arrangement 96 which will be described later) is 1 kgf/cm² or less (not including 0) in gauge pressure. Even if the gas pressure is made higher than that value, the consumption of the dry gas 86 increases in vain. More specifically, it is preferable that the pressure of this dry gas 86 is set within the range of 0.2 to 0.5 kgf/cm² in gauge pressure from the point of view that the above-described effect of preventing the atmosphere from flowing in and the reduction of the gas consumption are made compatible with each other well.

According to this holder driving device 30, not only the atmosphere near the atmosphere-side entrance portion of a gap 53 between the lower end portion of the bearing unit 36 and the shaft 34 passing the end portion can be replaced by the dry gas 86 supplied to the purge chamber 84, but also the purge chamber 84 can aggressively prevent the atmosphere from flowing from the atmosphere side toward the bearing unit 36 through the purge chamber 84. Accordingly, the atmosphere, and hence moisture in the atmosphere, can be prevented from flowing into the first stage exhaust chamber 52 of the bearing unit 36.

As a result, even if the shaft 34 is driven and reciprocated linearly at a high speed, the vacuum seal performance in the bearing unit 36 can be prevented from being deteriorated, and the degree of vacuum in the vacuum vessel 4 can be prevented from being reduced.

For example, even if the rate of scanning the holder 32 mechanically in the direction Y is raised to 500 mm/sec, the lowering in the degree of vacuum vessel 4 can be suppressed not larger than about 10% of the ultimate degree of vacuum (for example, about 1 to $5 \times^{-7}$ Torr). The scanning rate of the holder 32 in the ion-implantation apparatus is usually set within the range of from about 100 to 300 mm/sec, roughly, 100 to 500 mm/sec. This holder driving device 30 can be used to cope with the lowering of the degree of vacuum sufficiently.

In addition, according to this holder driving device 30, it is not necessary to increase the number of stages of differential pumping or elongate the gap between the shaft 34 and the housing in the direction along the shaft 34 in order to improve the vacuum seal performance of the bearing unit 36. It is therefore possible to put the lengthwise size of the holder driving device 30 sufficiently within the value limited by the above-described beam line height H. In addition, as the vacuum pump 60 and 62, it is not necessary to use pumps of particularly high pumping speed. Accordingly, it is possible to reduce the factors of increasing the cost.

In addition, the holder driving device 10 shown in FIG. 5 uses the gas bearing unit 16, so that it is necessary, as described above, to control the size of the gap between the shaft 14 and the housing (sleeve) 17 to be an extremely small value (for example, not larger than about 13 μm as mentioned above). It is therefore necessary to finish the shaft 14 and the housing 17 with high accuracy, so that there arises a problem that the finishing cost increases. On the other hand, in the bearing unit 36 using the mechanical direct-acting bearings 42 and 44, the size of gaps between the shaft 34 and the housings 38, 40 and 82 may be made about three or four times as large as that in the conventional example in FIG. 5, as described above. Finishing the gaps with such a size is comparatively easy, so that there is another advantage that the cost of finishing the shaft and the housing can be reduced. This applies to the following embodiment.

Further, in the gas bearing unit 16 in FIG. 5, it is necessary to supply the compressed gas 24 of high pressure (for example, about 6 kgf/cm² in gauge pressure as mentioned above) in order to realize gas bearing, as described above. Therefore, the flow of the compressed gas 24 increases correspondingly to the high pressure, so that the consumption of the gas 24 increases to thereby increase the cost. In addition, the quantity of the compressed gas 24 flowing into the exhaust chambers 21 to 18 and so on also increases correspondingly to the high pressure. In order to avoid the deterioration of the degree of vacuum in the vacuum vessel 4 caused by the feed of the compressed gas 24, it is necessary to increase the pumping speed of the vacuum pumps for vacuum-pumping the exhaust chambers 18 to 21, or to increase the number of stages of differential pumping. When the pumping speed of the vacuum pumps is increased, the cost is increased correspondingly. It is also difficult to increase the number of stages of differential pumping because of the limitation of the lengthwise size as described above.

On the other hand, in the bearing unit 36, the pressure of the dry gas 86 supplied to the gas replacement mechanism 80 may be about ¹⁄₁₀ or less as high as that of the compressed gas 24 in the conventional example in FIG. 5 as described above. Therefore, it is possible to reduce the consumption of the dry gas 86 correspondingly to thereby reduce the cost. In addition, the quantity of the dry gas 86 flowing into the exhaust chambers 50 and 52 can be reduced correspondingly to the low pressure, so that the deterioration of the degree of vacuum in the vacuum vessel 4 caused by the feed of the dry gas 86 can be ignored. Therefore, it is not necessary to increase the pumping speed of the vacuum pumps for vacuum-pumping the exhaust chambers, or to increase the number of stages of differential pumping, unlike in the conventional example. Accordingly, there is no problem that the cost of the vacuum pumps is increased, or that the lengthwise size is against its limitation. This applies to the embodiment which will be described later.

And further, as shown in FIGS. 1 and 2, the exhaust chamber 50 on the vacuum vessel 4 side can be provided so as to surround a part of an outer ring of the mechanical direct-acting bearings 42. This construction is also effective for the limitation of the lengthwise size.

Figure 3:
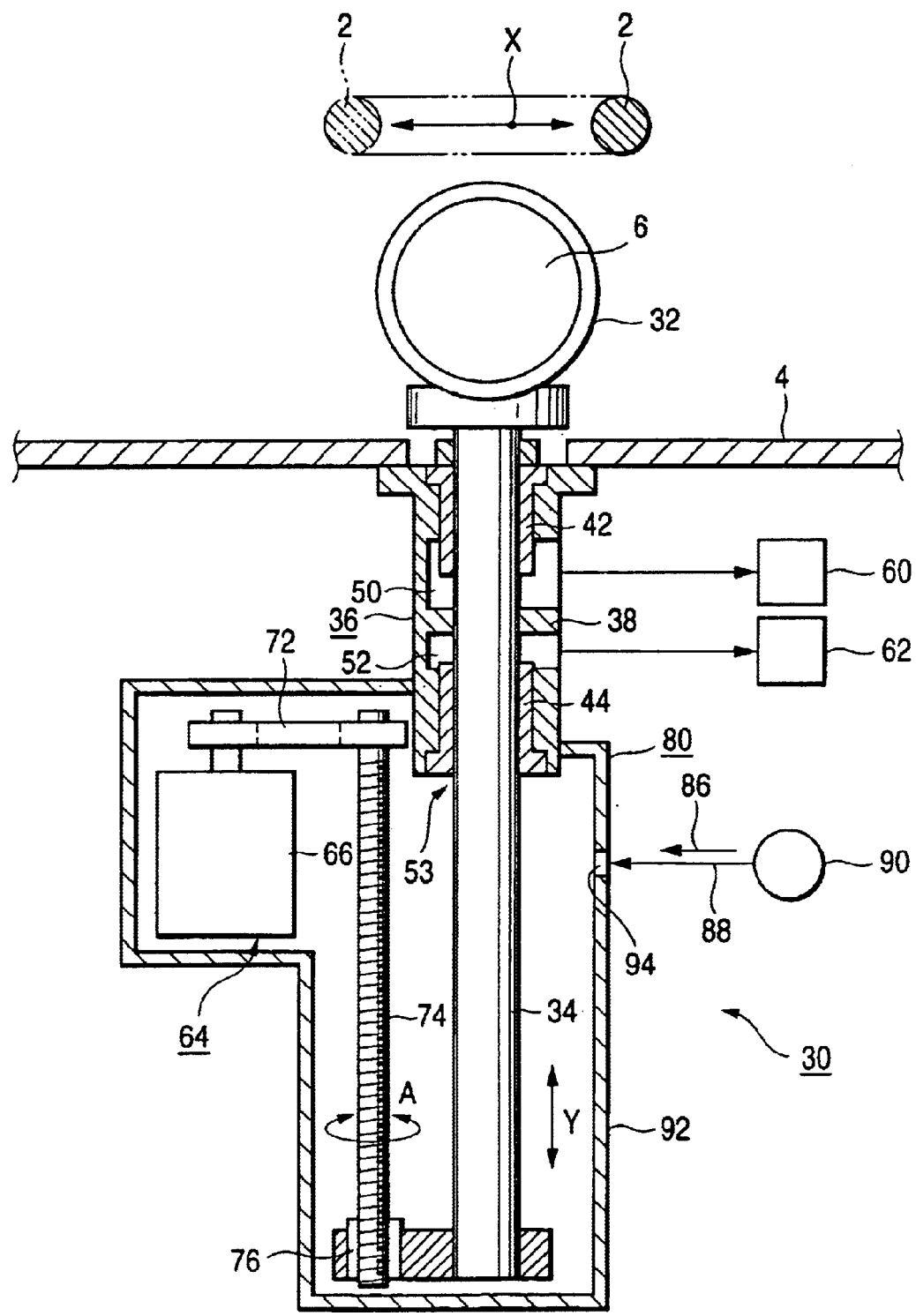
FIG. 3 is a diagram partially illustrating an ion-implantation apparatus of a hybrid scan system with another embodiment of the holder driving device according to the present invention.
Figure 4:
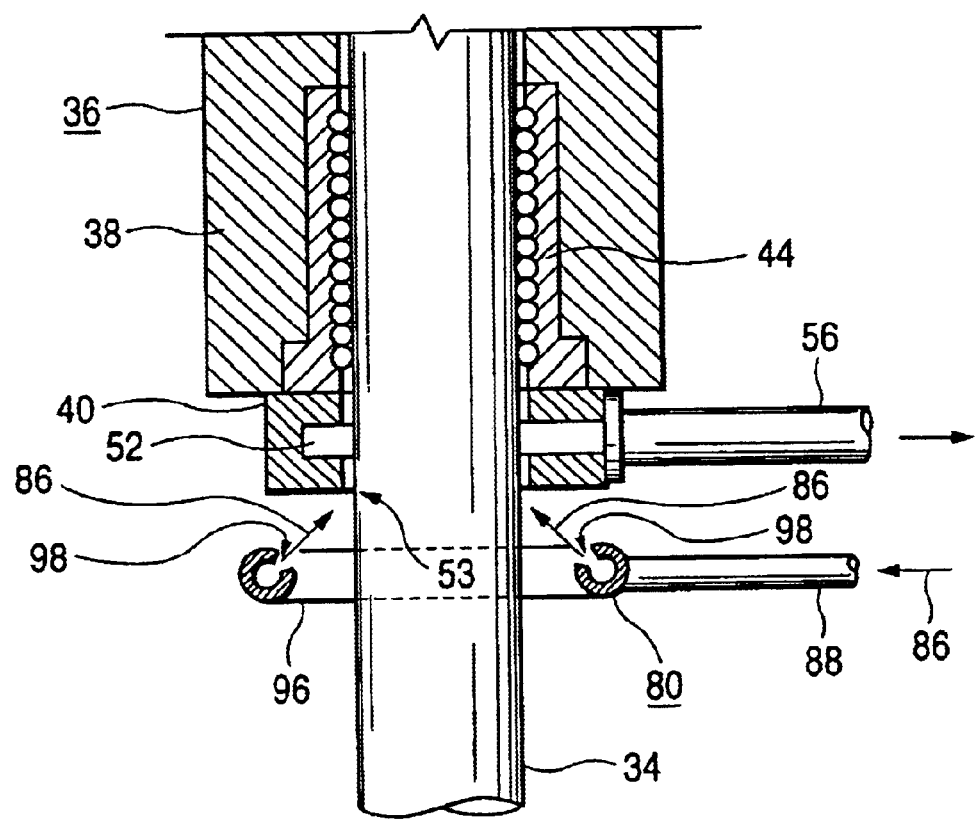
FIG. 4 is a diagram illustrating another example of the gas replacement mechanism.

As in the embodiment shown in FIG. 3, the gas replacement mechanism 80 may be constituted by: an isolation vessel 92 which surrounds, with separation from the atmosphere, the end portion of the bearing unit 36 on the side opposite to the vacuum vessel 4, the shaft 34 projecting outside from the end portion, and the whole of the periphery of the driver 64 for driving the shaft 34; and a gas supply means (in this embodiment, a dry gas source 90 and a pipe arrangement 88 in the same manner as mentioned above) for supplying the isolation vessel 92 with dry gas 86 of positive pressure as mentioned above, through a gas inlet 94.

According to this gas replacement mechanism, it is possible to perfectly replace the atmosphere by the dry gas 86 not only in the portion near the atmosphere-side entrance portion of the gap 53 at the lower end portion of the bearing unit 36 but also in the portion surrounding the shaft 34 projecting outside from the bearing unit 36 perfectly. Accordingly, it is also possible to perfectly prevent moisture in the air from adhering onto the surface of the shaft 34 and from entering the bearing unit 36 along the surface of the shaft 34. As a result, although the size of the unit is a little larger than that in the embodiments shown in FIGS. 1 and 2, the effect to prevent moisture in the atmosphere from flowing into the first stage exhaust chamber 52 of the bearing unit 36 is improved.

In the case where the above-mentioned range is merely enclosed by the isolation vessel 92, if the positive-pressure dry gas 86 is not supplied into the isolation vessel 92, the isolation vessel 92 is pumped to negative pressure by the vacuum pumps 60, 62 and so on through gaps such as the gap 53, etc., so that there is a possibility that the atmosphere is sucked from the outside into the isolation vessel 92. This can be however prevented by the feed of the positive-pressure dry gas 86 into the isolation vessel 92.

Further, as shown in the embodiment shown in FIG. 4, the gas replacement mechanism 80 may be constituted by: an annular pipe arrangement 96 having a plurality of, preferably a number of, nozzles 98 provided, substantially at regular intervals, on its circumference so as to face the atmosphere-side entrance portion of the gap 53 at the lower end portion of the bearing unit 36; and a gas supply means (in this embodiment, a dry gas source 90 and a pipe arrangement 88 in the same manner as mentioned above) for supplying positive pressure dry gas 86, as mentioned above.

Also according to this gas replacement mechanism 80, the dry gas 86 is spouted from the respective nozzles 98 toward the atmosphere-side entrance portion of the gap 53, so that the atmosphere near the entrance portion can be replaced by the dry gas 86. Accordingly, it is possible to prevent the atmosphere, and hence moisture in the atmosphere, from flowing into the first stage exhaust chamber 52 of the bearing unit 36 through the portion of the gap 53.

Although the gradual pressure-reduction (that is, gradual increase of the degree of vacuum) from the atmosphere side toward the first stage exhaust chamber 52, the next stage exhaust chamber 50 and the vacuum vessel 4 is realized by means of the reduction in conductance of the gap portion without using any packing such as an O-ring or the like in the above-described bearing unit 36, a packing such as an O-ring or the like may be used instead of or together with the reduction of conductance in the gap portion. Also in that case, it is not necessary to expect the packing to prevent moisture from passing through. Since the above-mentioned gas replacement mechanism 80 has the effect to prevent the passage of moisture, the vacuum seal performance equivalent to or better than that described above can be obtained in this bearing unit 36.

In addition, the number of stages of differential pumping, that is, the number of exhaust chambers for differential pumping in the bearing unit 36 is not limited to two as in the above-mentioned embodiment, but it will do to set the number to one or more. Specifically, the number may be decided in accordance with required vacuum seal performance, etc.

In addition, although the above-mentioned directions X and Y merely express two substantially orthogonal directions, on the contrary to the above example, the directions X and Y may be regarded as vertical and horizontal directions respectively, or the directions X and Y may be regarded as those inclined with respect to the vertical direction. In either case, according to the holder driving device 30, it is possible to avoid such a problem that the lengthwise size in the direction along the shaft 34 is against its limitation.

The present invention, which is configured thus, has the following effects.

By means of a gas replacement mechanism as described above, the atmosphere, and hence moisture in the atmosphere, can be prevented from flowing into a first stage exhaust chamber of a bearing unit. Accordingly, it is possible to prevent the vacuum seal performance in the bearing unit from being deteriorated even when a shaft is driven to reciprocate linearly at a high speed.

As a result, it is not necessary to increase the number of stages of differential pumping in the bearing unit, to elongate a gap portion in the direction along the shaft, or to particularly increase the pumping speed of vacuum pumps.

In addition, because mechanical direct-acting bearings are used in the bearing unit, finishing the shaft and housing becomes easier than that in the conventional example using a gas bearing unit, so that it is possible to reduce the finishing cost. Further, because the pressure of dry gas supplied to the gas replacement mechanism is much lower than that of compressed gas in the conventional example using a gas bearing unit, it is not necessary to increase the pumping speed of the vacuum pumps for differential pumping or to increase the number of stages of differential pumping.

Further, by means of a purge chamber provided as described above, the same or better effects can be obtained with a compact configuration.

And further, by means of an isolation vessel is provided as described above, although the size is a little larger than that of the device having a purge chamber, it is possible to prevent, more surely, the atmosphere, and hence moisture in the atmosphere, from flowing into the first stage exhaust chamber of the bearing unit, so that it is possible to prevent, more surely, the vacuum seal performance of the bearing unit from lowering.

The foregoing description of the preferred embodiments of the invention has been presented for the purpose of illustration and description only. It is not intended to be exhaustive or to limit the invention to the precise form disclosed, and modifications and variations are possible in light of and within the scope of the invention. The preferred embodiments were chosen and described in order to explain the principles of the invention and its practical application to enable one skilled in the art to utilize the invention in various embodiments and with various modifications as are suited to the particular use contemplated. It is intended that the scope of the invention be defined by the claims appended hereto, and equivalents thereof.

What is claimed is:

1. A holder driving device comprising:
  a holder holding a substrate, the holder provided in a vacuum vessel disposed in the atmosphere;
  a shaft supporting the holder and penetrating the vacuum vessel;
  a driver provided outside the vacuum vessel and driving the shaft reciprocatingly and linearly in an axial direction of the shaft;
  a bearing unit attached on the outside of the vacuum vessel so that the shaft passes through the bearing unit, and the bearing unit having at least one of mechanical linear motion bearings for supporting the shaft and at least one of exhaust chambers surrounding the shaft;
  a vacuum pump for vacuum-pumping the exhaust chambers of the bearing unit; and
  a gas replacement mechanism for supplying dry gas in the neighborhood of an atmosphere-side entrance portion of a gap between an end portion of the bearing unit of a side opposite to the vacuum vessel and the shaft passing the end portion, so as to replace the atmosphere in the vicinity of the entrance portion by the dry gas, the dry gas being lower in humidity than at least the surrounding atmosphere and being a positive pressure.

2. A holder driving device according to claim 1, wherein the gas replacement mechanism includes a purge chamber provided so as to partition between the end portion of the bearing unit opposite side to the vacuum vessel and an end portion of the gas replacement mechanism opposite side to the vacuum vessel and surrounding the shaft passing through the end portion, and a gas supply means for supplying the purge chamber with the dry gas.

3. A holder driving device according to claim 1, wherein the gas replacement mechanism includes an isolation vessel, surrounding the end portion of the bearing unit on the side opposite to the vacuum vessel, the shaft projecting outside from the end portion, and the whole of the periphery of the driving device for driving the shaft, so as to separate from the atmosphere, and a gas supply means for supplying the isolation vessel with the dry gas.

4. A holding driving device according to claim 1, wherein the gas replacement mechanism includes an annular pipe arrangement having a plurality of nozzles provided thereon so as to face the atmosphere-side entrance portion and a gas supply means for supplying the annular pipe arrangement with the dry gas.

5. A holding driving device according to claim 1, wherein the mechanical linear motion bearings is a linear ball bearing.

6. A holding driving device according to claim 1, wherein the exhaust chambers is provided so as to surround a part of an outer ring of the mechanical linear motion bearing around the shaft.

* * * * *

UNITED STATES PATENT AND TRADEMARK OFFICE
CERTIFICATE OF CORRECTION

PATENT NO. : 6,805,487 B1
DATED : October 19, 2004
INVENTOR(S) : Satoru Yuasa et al.

It is certified that error appears in the above-identified patent and that said Letters Patent is hereby corrected as shown below:

Title page,
Item [57], ABSTRACT,
Line 13, "one" should read -- on --.

Column 12,
Line 15, "is" should read -- are --.

Signed and Sealed this

Twenty-eighth Day of December, 2004

JON W. DUDAS
*Director of the United States Patent and Trademark Office*